US011391801B2

(12) United States Patent
David (10) Patent No.: US 11,391,801 B2
(45) Date of Patent: Jul. 19, 2022

(54) MAGNETIC RESONANCE (MR) DATA ACQUISITION USING DIFFERENT FLIP ANGLES

(71) Applicant: Siemens Healthcare GmbH, Erlangen (DE)

(72) Inventor: Grodzki David, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/597,186

(22) Filed: Oct. 9, 2019

(65) Prior Publication Data

US 2020/0110143 A1    Apr. 9, 2020

(30) Foreign Application Priority Data

Oct. 9, 2018  (EP) ...................................... 18199259

(51) Int. Cl.
```
G01V 3/00       (2006.01)
G01R 33/483     (2006.01)
G01R 33/36      (2006.01)
G01R 33/48      (2006.01)
```
(52) U.S. Cl.
CPC ..... *G01R 33/4835* (2013.01); *G01R 33/3614* (2013.01); *G01R 33/4828* (2013.01)

(58) Field of Classification Search
CPC .............. G01R 33/543; G01R 33/5659; G01R 33/3415; G01R 33/36; A61B 5/055
USPC ....................................................... 324/309
See application file for complete search history.

(56) References Cited

U.S. PATENT DOCUMENTS

| | | | |
|---|---|---|---|
| 2016/0238685 A1* | 8/2016 | Neji ................... | G01R 33/4835 |
| 2017/0146625 A1 | 5/2017 | Beck et al. | |
| 2017/0322276 A1* | 11/2017 | Bhat .................. | G01R 33/4835 |
| 2018/0238983 A1 | 8/2018 | Cohen | |

FOREIGN PATENT DOCUMENTS

| | | | |
|---|---|---|---|
| DE | 102015222833 A1 | 5/2017 | |
| DE | 102016207638 A1 | 11/2017 | |

OTHER PUBLICATIONS

Alice Yang et al.: "Simultaneous Multislice MRF with Hadamard RF-Encoding"; Proceedings of the International Society for Magnetic Resonance in Medicine; ISMRM; 25th Annual Meeting and Exhibition; Honolulu, HI, USA; Apr. 22-Apr. 27, 2017; No. 3838; Apr. 7, 2017 (Apr. 7, 2017); XP040691406.

(Continued)

*Primary Examiner* — Walter L Lindsay, Jr.
*Assistant Examiner* — Frederick Wenderoth
(74) *Attorney, Agent, or Firm* — Banner & Witcoff Ltd.

(57) ABSTRACT

The disclosure relates to techniques to acquire at least one quantitative physiological parameter using a magnetic resonance system by means of MR fingerprinting. In this process, a plurality of slices are excited simultaneously using different imaging parameters to produce MR signal evolutions in each of the plurality of slices, and the MR data from the plurality of slices is then acquired simultaneously. For the simultaneous excitation of the plurality of slices, a flip angle (FW) that is used to excite one of the plurality of slices differs from a flip angle (FW) that is used to excite another of the plurality of slices.

17 Claims, 3 Drawing Sheets

(56) References Cited

OTHER PUBLICATIONS

Ouri Cohen et al: "Algorithm comparison for schedule optimization in MR fingerprinting"; Magnetic Resonance Imaging; vol. 41; Sep. 1, 2017 (Sep. 1, 2017); pp. 15-21; XP055572914; Tarrytown, NY, US; ISSN: 0730-725X; DO1: 10.1016/j.mri.2017.02.010.
Bo Zhao et al: "Optimal Experiment Design for Magnetic Resonance Fingerprinting: Cramer-Rao Bound Meets Spin Dynamics"; arxiv.org; Cornell University Library; 201 Olin Library Cornell University Ithaca; NY 14853; Oct. 23, 2017 (Oct. 23, 2017); XP081060780; DOI: 10.1109/TMI.2018.2873704.
Yun Jiang et al: "Use of pattern recognition for unaliasing simultaneously acquired slices in simultaneous multislice MR fingerprinting : Simultaneous Multislice MR Fingerprinting"; Magnetic Resonance in Medicine.; vol. 78; No. 5; Dec. 26, 2016 (Dec. 26, 2016); pp. 1870-1876; XP055503004; US; ISSN: 0740-3194; DOI: 10.1002/mrm.26572.
European Search Report for Patent Application No. 18199259.5; dated Apr. 2, 2019.

\* cited by examiner

MAGNETIC RESONANCE (MR) DATA ACQUISITION USING DIFFERENT FLIP ANGLES

CROSS-REFERENCE TO RELATED APPLICATIONS

The present application claims the benefit of the filing date of European patent application no. EP 18199259.5, filed on Oct. 9, 2018, the contents of which are incorporated herein by reference in their entirety.

TECHNICAL FIELD

The present disclosure relates to acquiring magnetic resonance (MR) data for MR fingerprinting and, in particular, to acquiring MR data by simultaneously implementing different flip angles.

BACKGROUND

Unlike computed tomography, in clinical MR imaging, qualitatively weighted MR images, in which an advantageous contrast exists between different substances, are usually generated rather than quantitative pixel values of physical parameters. Measuring quantitative physical values has some advantages over measuring qualitative physical values, for instance better reproducibility (even when using different scanner types from different manufacturers) and hence better comparability. Using conventional methods to measure quantitative values, however, is both relatively slow and inaccurate, and therefore these conventional methods are rarely used in clinical imaging.

SUMMARY

A more recent technique for measuring quantitative physical values is MR fingerprinting (MRF), which can be used to measure a plurality of physical values (e.g. T1, T2) pixel-by-pixel simultaneously in one measurement. In MR fingerprinting, a single-shot technique is preferably used to capture numerous MR images in succession, with measurement parameters such as TR, flip angle, etc. being varied for each pixel or voxel, with the result that different signal evolutions are produced pixel-by-pixel across the acquired MR images according to the physical properties of the substance. By comparing with databases, these signal evolutions (fingerprints) can be associated with an n-tuple of physical values.

The T1 and T2 maps produced by MR fingerprinting can be used directly for diagnosis by the radiologists or (because radiologists are unfamiliar with quantitative maps) for computing synthetic MR images containing usual qualitative contrasts. In particular, this also has a major advantage in that numerous conventional contrasts can be computed from the MR fingerprinting dataset, which means that the method can save a great deal of time.

MR fingerprinting data may be captured in a two-dimensional manner or in a three-dimensional manner. Three-dimensional data acquisition has an advantage in that it is possible to capture larger volumes quickly. Sometimes, however, problems arise with the three-dimensional data acquisition as a result of k-space undersampling.

In particular, with the two-dimensional acquisition of MR fingerprinting data, the magnetic resonance system, more precisely the RF power amplifier of the magnetic resonance system, may become overloaded because of the (on average) short repetition times and large flip angles. Overloading of this type can manifest itself as smaller maximum flip angles (i.e. because of the overload, the maximum flip angle that is currently possible is smaller than without any overload), or even worse as pulse-clipping. In the case of pulse-clipping, an amplitude (e.g. of a gradient pulse) is maintained below a certain threshold value. For example, a B1 with an amplitude of 30 µT may be required throughout a pulse. The threat of an overload, however, means that all the amplitudes are maintained below the threshold value of 20 µT, and this is referred to as pulse-clipping. This "clipping" means that the pulse shape that is actually output does not match the required pulse shape, which has a negative impact on the spectral properties such as slice profile, etc.

Therefore, an object of the embodiments described throughout the present disclosure is to prevent overloading of the magnetic resonance system and, in particular, to prevent overloading of the RF power amplifier of the magnetic resonance system during MR fingerprinting without the need for pulse clipping, for instance.

This object is achieved by a method for acquiring at least one quantitative physical parameter using a magnetic resonance system by means of MR fingerprinting, by a magnetic resonance system, by a computer program product, and by an electronically readable data storage medium as claimed in as claimed in the independent claims. The dependent claims further define preferred and advantageous embodiments of the present disclosure.

The present disclosure provides a method for acquiring one or more quantitative physiological or physical parameters of a subject under examination (e.g. a patient) using a magnetic resonance system by means of MR fingerprinting. The method according to the disclosure comprises the following steps:

Simultaneous excitation of a plurality of slices (e.g. at least two), with different imaging parameters being employed to produce MR signal evolutions in each of the slices. In particular, in each of the slices, the different imaging parameters produce, for the same pixel of the slice concerned, a specific MR signal evolution (fingerprint) of the MR signal.

Simultaneous acquisition of the MR data from the plurality of slices, from which then the pixel-specific MR signal evolutions (fingerprints) can be reconstructed, in particular for the plurality of slices.

In the simultaneous excitation of the plurality of slices, a flip angle that is used to excite one of these slices differs from a flip angle that is used to excite another of the slices. Thus in particular, the flip-angle characteristics of at least two of the simultaneously excited slices differ from one another.

The simultaneous excitation and acquisition of a plurality of slices is commonly also known as SMS (Simultaneous Multi-Slice). The simultaneous excitation according to the disclosure of a plurality of slices and the simultaneous acquisition of MR data from these slices allows MR images to be reconstructed for these plurality of slices.

Quantitative maps of physical parameters such as T1, T2, off-resonance, M0, etc., can be generated for each of the slices by varying imaging parameters such as flip angle (FW), TR, TE, TI, etc., during the excitation and acquisition of the MR data.

As the flip angles of at least two of the simultaneously excited slices differ, it is possible, for example, to set the flip angle of one of these two slices to a maximum, while setting the flip angle of the other of these two slices below its maximum. The load on the RF power amplifier is thereby advantageously lower than when the flip angle of both slices is set to a maximum value.

According to an embodiment, a flip-angle characteristic for each of the plurality of slices is set such that the power that is needed to produce the flip-angle characteristics for the plurality of simultaneously excited slices and provided by the RF power amplifier of the magnetic resonance system is adjusted to suit the power limits of this RF power amplifier. In other words, in this embodiment, the flip-angle characteristics of the plurality of simultaneously excited slices are thereby adjusted to suit the power limits of the RF power amplifier in use.

In particular, this adjustment of the flip-angle characteristics for the simultaneously excited slices to suit the power limits of the RF power amplifier allows the flip-angle characteristics to be set such that the power limits of the RF power amplifier are not exceeded. Furthermore, the flip-angle characteristics for the simultaneously excited slices can be selected so as to achieve a particularly advantageous utilization or power usage of the RF power amplifier (for instance uniformly using power).

According to another embodiment, the flip-angle characteristics of the simultaneously excited slices can be set, for example, such that whenever a certain one of these slices has a particularly high flip angle, another of the slices has a correspondingly smaller flip angle. For instance, a sum of the flip angles that are used to excite the plurality of slices at one instant in time may be smaller than a predetermined threshold value, which is defined according to the power limits of the RF power amplifier in use.

The threshold value is advantageously selected such that the sum of the flip angles, which takes into account this threshold value, does not result in the power limits of the RF amplifier in use being exceeded at any time. This advantageously ensures that the power limits of the RF power amplifier are not exceeded during the acquisition of the MR data according to the embodiments of the present disclosure.

In particular, the sum of the flip angles that are used to excite the simultaneously excited slices can be kept constant at all times. In such a case, the set flip-angle characteristics advantageously ensure a uniform power demand from the RF power amplifier.

It is also possible according to the disclosure, however, that the flip angles used to excite the slices result in peaks in the power demand from the RF power amplifier. In this case, these peaks (and also the other power demands on the RF power amplifier) are advantageously set such that the RF power amplifier is not overloaded.

According to another embodiment, the flip-angle characteristics can be adjusted to suit the tissue to be measured in the slice concerned, or to suit the substance to be measured in the slice concerned.

If the imaging parameters of an MR fingerprinting measurement are adjusted to suit a tissue to be measured by taking into account the expected physical tissue properties, it is possible to advantageously achieve very high accuracy when acquiring the actual physical properties of this tissue. In this case, it is possible according to the embodiments of the present disclosure to adjust the flip-angle characteristic of one of the simultaneously-excited slices to suit one tissue type while adjusting the flip-angle characteristic of another of the simultaneously-excited slices to suit another tissue type. In other words, the flip-angle characteristics of the simultaneously excited slices can be adjusted to suit the same tissue type or different tissue types.

In MR measurements of the head of a subject under examination, there are often significantly different substances present at the base of the skull of the head compared with in the upper region of the patient's head. Thus, it makes complete sense for such head measurements to adjust the flip-angle characteristic of a slice in the region of the base of the skull to suit a different substance compared with a slice in the upper head region.

It is also conceivable according to the embodiments of the present disclosure to adjust the flip-angle characteristics to suit the substance to be measured once the MR fingerprinting measurement is in progress. This is done, for example, by determining in a first stage of a method according to the disclosure, one or more substances for each slice from results of a fingerprinting measurement. In a second stage of the method, which follows the first stage, the flip-angle characteristic for each of the plurality of simultaneously excited slices can then be set according to the substance(s) that were determined in the first stage for the slice concerned. It is therefore conceivable to acquire the MR data in the first stage using identical settings, provided this does not result in the power limits of the RF power amplifier being exceeded.

The present disclosure also provides a magnetic resonance system, which comprises an RF control unit, an RF power amplifier, a gradient control unit, an image sequence controller, and a processing unit. This magnetic resonance system is designed to acquire at least one quantitative physiological or physical parameter by means of fingerprinting. In addition, the magnetic resonance system is designed to use the RF control unit and the RF power amplifier to simultaneously excite a plurality of slices using different imaging parameters to produce MR signal evolutions, and to use the gradient control unit and the image sequence controller to acquire simultaneously MR data from the plurality of slices for an MR fingerprinting measurement. The magnetic resonance system is designed to set, for the simultaneous excitation of the plurality of slices, a flip angle that is used to excite one of the plurality of slices to be different from a flip angle that is used to excite another one of the plurality of slices.

The advantages of the magnetic resonance system according to the disclosure are essentially the same as the advantages of the method according to the disclosure, which have been explained in detail above and therefore are not repeated here.

In addition, the present disclosure describes a computer program product, such as software, which can be loaded into a memory of a programmable control device or into a processing unit of a magnetic resonance system. This computer program product can be used to implement all, or a variety of, the embodiments described above of the method according to the disclosure when the computer program product is executed in the control device. In this context, the computer program product may require program means, e.g. libraries and auxiliary functions, for implementing the relevant embodiments of the method. In other words, the claims and other descriptions herein directed to the computer program product is intended to provide protection in particular for software that can be used to implement one of the above-described embodiments of the method according to the disclosure, and/or implement said embodiment. Said software may be, for instance, a source code (e.g. C++), which still needs to be compiled and linked or may just need to be interpreted, or an executable software code, for which execution only needs to be loaded into the relevant processing unit or control device.

Finally, the present disclosure describes an electronically readable data storage medium (e.g., a non-transitory computer-readable media), for instance a DVD, a magnetic tape, a hard disk, or a USB stick, on which is stored electronically readable control data, in particular software (see above). When this control data (software) is read from the data storage medium and stored in a control device and/or processing unit of a magnetic resonance system, all the embodiments according to the disclosure of the above-described method can be performed.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

The present disclosure is described in detail below using embodiments according to the disclosure with reference to the figures. The exemplary embodiments of the present disclosure will be described with reference to the accompanying drawings. The drawing in which an element first appears is typically indicated by the leftmost digit(s) in the corresponding reference number.

DETAILED DESCRIPTION

Figure 1:
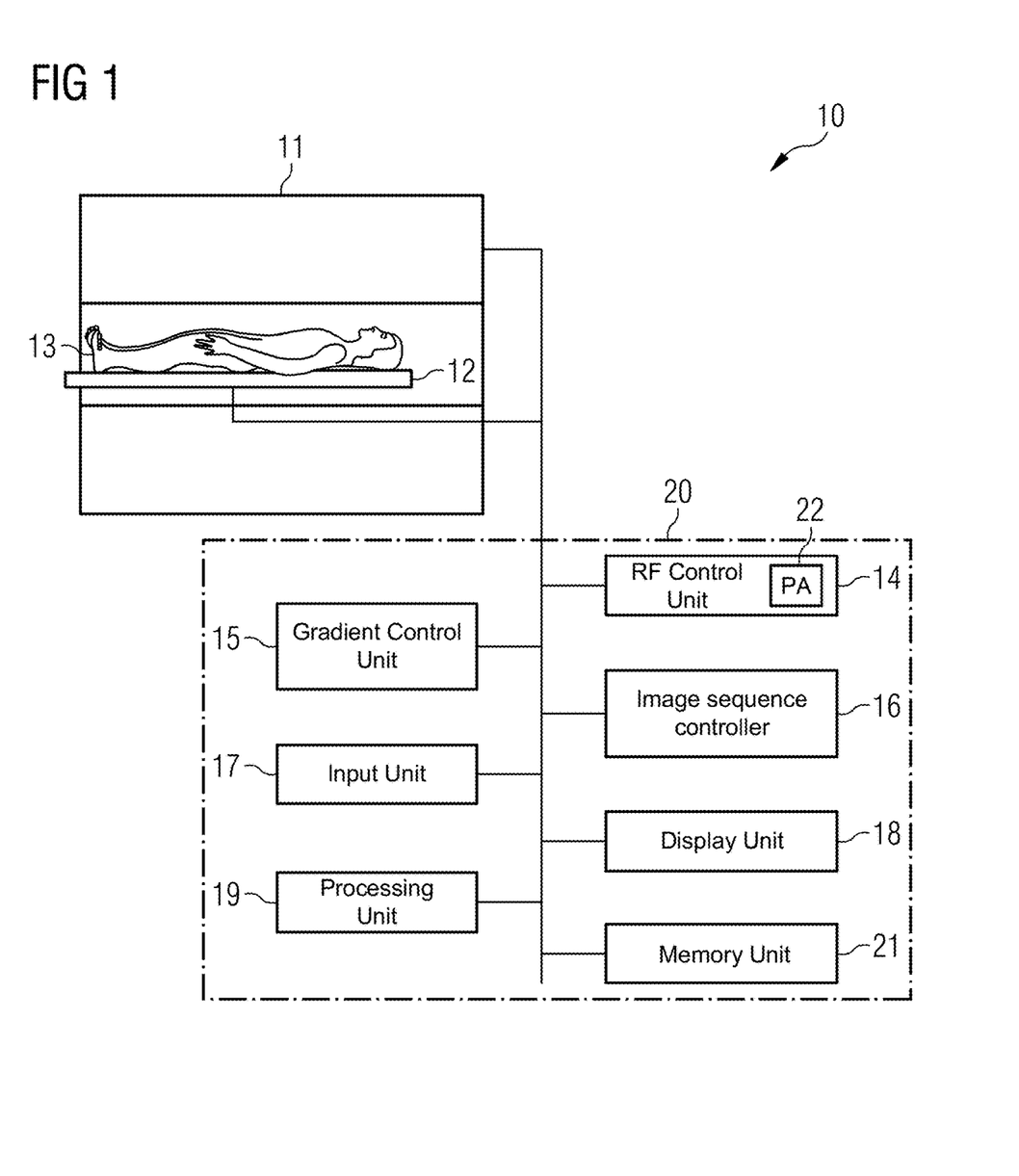
FIG. 1 illustrates a magnetic resonance system, in accordance with an embodiment of the present disclosure.

FIG. 1 illustrates a magnetic resonance system, in accordance with an embodiment of the present disclosure. A magnetic resonance system 10 is presented with reference to FIG. 1, which system is used, as explained below, to acquire according to the disclosure MR fingerprinting data. As shown in FIG. 1, the magnetic resonance system 10 comprises a magnet 11 for generating a polarization field B0, where a person under examination 13 arranged on a couch 12 is moved into the magnet 11 to thus acquire spatially-encoded magnetic resonance signals or MR data from the person under examination 13.

The coils used for the signal acquisition, for instance coils such as a body coil or local coils, are not shown for reasons of clarity. By applying radio frequency (RF) pulses, and by switching magnetic field gradients, the magnetization produced by the polarization field B0 can be deflected out of the equilibrium position and spatially encoded, and the resultant magnetization is then detected by the receive coils. The principles of how MR images can be produced by applying RF pulses and switching magnetic field gradients in various combinations and sequences are known, and thus are not explained in further detail.

The magnetic resonance system 10 also comprises a control device 20, which may be configured as any suitable type of controller that may be used to control the magnetic resonance system 10. Each component of the control device 20 may include any suitable configuration of hardware, processors, and/or processing circuitry configured to perform and functionally realize the respective functions of each component as described herein. For instance, the control device 20 comprises a gradient control unit 15 for controlling and switching the necessary magnetic field gradients. An RF control unit 14 comprising RF power amplifier (PA) 22 is provided for controlling and generating the RF pulses for deflecting the magnetization. An image sequence controller 16 controls the sequence of the magnetic field gradients and RF pulses, and hence indirectly controls the gradient control unit 15 and the RF control unit 14. An operator can control the magnetic resonance system 10 via an input unit 17, and MR images and other information needed for control can be displayed on a display unit 18. A processing unit 19 comprising at least one processor unit (e.g. processing circuitry, not shown) is provided for controlling the various units in the control device 20 and for performing arithmetic operations. In addition, a memory unit 21 is provided, in which can be stored, for example, program modules and/or programs, which can control the running of the magnetic resonance system 10 when they are executed by the processing unit 19 or its processor unit. The processing unit 19 is designed to determine physical parameters or to compute MR images from the acquired MR signals.

Figure 2:
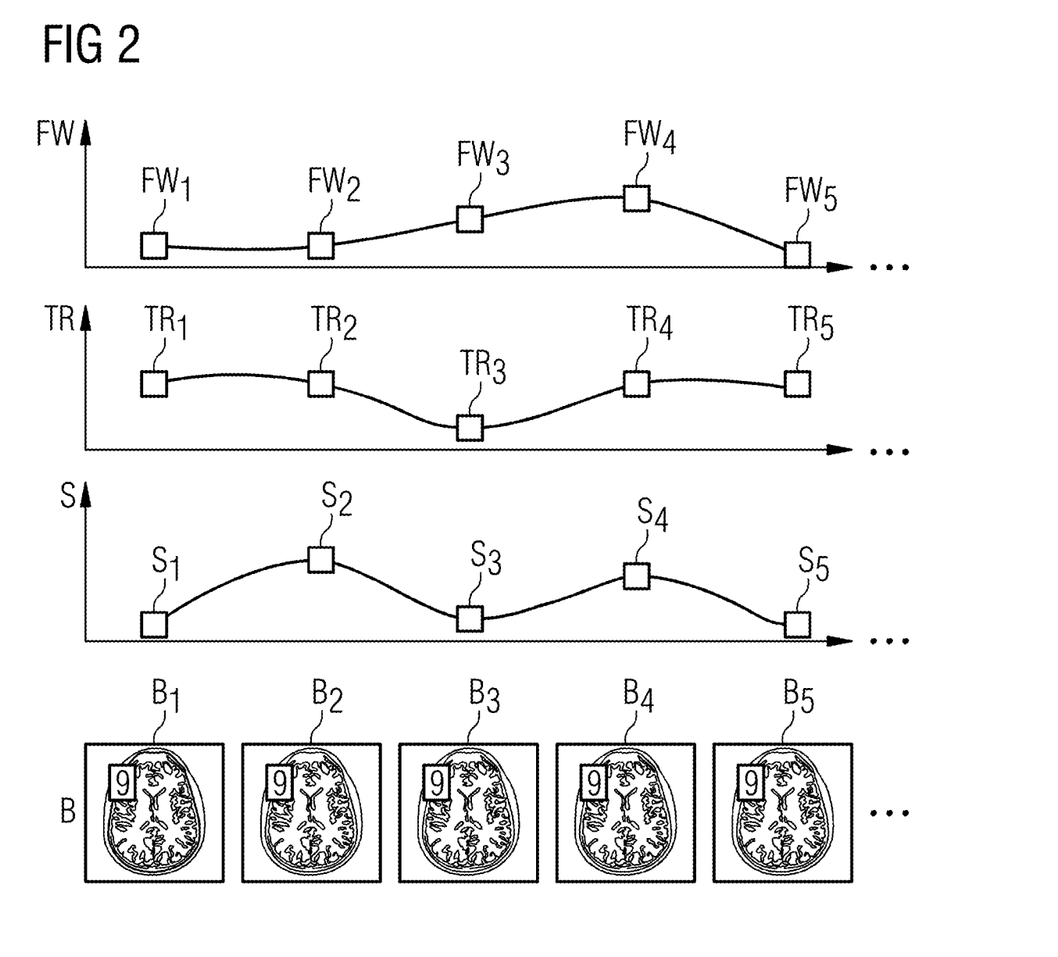
FIG. 2 illustrates an MR-fingerprinting data acquisition technique, in accordance with an embodiment of the present disclosure.

FIG. 2 illustrates an MR-fingerprinting data acquisition technique, in accordance with an embodiment of the present disclosure. FIG. 2 is used to explain the acquisition of MR data by means of fingerprinting.

As part of the MR fingerprinting measurement, an MR signal evolution (i.e. a characteristic of an MR signal S) is generated for each voxel 9. This requires generating a plurality of MR images B1-B5 from the same slice. For the purpose of generating the MR images B1-B5, a predetermined volume segment of the particular slice is sampled multiple times by sampling the k-space multiple times that corresponds to the volume segment to acquire MR data. For this purpose, different imaging parameters or measurement parameters (flip angle FW, repetition time TR, etc.) are used for each sampling of k-space.

The characteristic of the flip angle FW is denoted in FIG. 2 for one slice by the reference signs FW1 to FW5, and the characteristic of the repetition time TR by the reference signs TR1 to TR5. These measurement parameters FW, TR, which are individual to the particular k-space, are used to sample that particular k-space. The MR images B1 to B5 are reconstructed by reconstructing the MR data acquired in this manner, where the MR signal S1 to S5 for the same voxel or pixel 9 for all the reconstructed MR images B1 to B5 is shown in FIG. 2 in the form of an MR signal evolution.

The magnetic resonance system 10 shown in FIG. 1 is configured to use fingerprinting to determine one or more quantitative physical parameters of voxels in a volume segment of a subject under examination from the MR signal evolution S1 to S5 reconstructed in each case. For this purpose, the magnetic resonance system 10 uses the RF control unit 14 and the RF power amplifier 22 to excite a plurality of slices of the volume segment simultaneously, to then acquire MR data for the slices. In this process, the flip angle of one of the plurality of simultaneously excited slices is different, in at least at one instant in time, from the flip angle of the other of the plurality of simultaneously excited slices. In other words, during at least at one instant in time, the flip-angle characteristic FW1-FW5 as shown in FIG. 2 for one of the simultaneously excited slices does not match (i.e. is not equal to) the flip-angle characteristic selected for the other one of the plurality of simultaneously excited slices.

The MR signal evolution S1 to S5 is then generated for a specific voxel 9 from the reconstructed MR images B1 to B5. One or more physical properties of the voxel 9 (e.g. a physical parameter or a substance component present in the voxel) are determined from this MR signal evolution S1 to S5, for example by the control device 20 (or another suitable device) searching a database for the physical properties associated with the particular MR signal evolution S1 to S5. In this database are stored the associated physical properties for each of the widely varied MR signal profiles.

Figure 3:
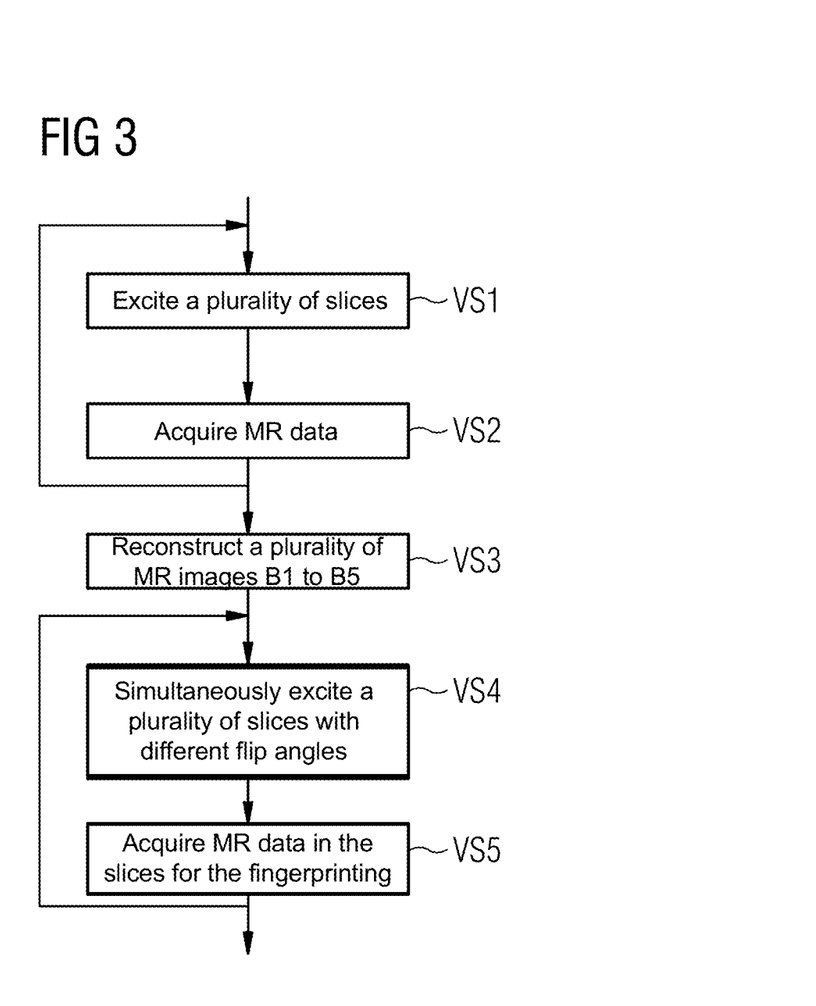
FIG. 3 illustrates a method flow diagram, in accordance with an embodiment of the present disclosure.

FIG. 3 illustrates a method flow diagram, in accordance with an embodiment of the present disclosure. In particular, the method 300 shown in FIG. 3 illustrates an embodiment for acquiring MR fingerprinting data. Again, the method 300 may be performed by any suitable component, such as via execution of a computer program product as noted above. For example, the method 300 may be executed by one or more processors and/or processing circuitry associated with the control device 20 as shown and described above with reference to FIG. 1. To provide an illustrative example, a computer program product may include executable instructions, logic, and/or code that may be stored on the memory unit 21 and executed by one or more components of the control device 20 (e.g. the processing unit 19) to realize the method 300. Embodiments include different components, which may not be illustrate din FIG. 1 for purposes of brevity but be in communication with the control device 20, preforming any portion of the method 300 in conjunction with or instead of the control device 20.

The method 300 may begin when a plurality of slices are excited (block VS1) simultaneously using different flip angles, while in the subsequent step, MR data is acquired (block VS2) in the slices. In an embodiment, the two steps VS1, VS2 may be repeated multiple times, with the result that for the same voxel 9 (see FIG. 2), the associated k-space is sampled multiple times using individual imaging parameters FW, TR, and on each occasion, MR data is acquired (block VS2). Based on the acquired (block VS2) MR data, the method 300 may include reconstructing (block VS3) a plurality of MR images B1 to B5 (see FIG. 2) for each of the plurality of simultaneously excited slices, with the result that a plurality of MR signals S1 to S5 are reconstructed for the same voxel 9 (and for any number of other voxels) in the particular slice. Then, the corresponding MR signal evolution (fingerprint) for the voxel concerned is used (block VS3) as the basis for determining the tissue properties or substance properties of this voxel.

New settings for the imaging parameters (e.g. the flip angle) for the particular slice are made on the basis of these tissue properties or substance properties, which settings ensure that at the same instant of time, at least the flip angles of two simultaneously excited slices are different. The new imaging parameters are adjusted here to suit the previously-determined substance properties in particular such that using the new imaging parameters, it is possible to reconstruct MR signal evolutions from which the physical properties or substance properties of the relevant voxel can be determined even more effectively (compared with using the initially set imaging parameters). The method 300 may include using (block VS4) these new imaging parameters to simultaneously excite a plurality of slices each using different flip angles. Thus, the simultaneous excitation (block VS4) corresponds to previous excitation of the plurality of slices (block VS1), except that the imaging parameters used in for the simultaneous excitation of a plurality of slices (block VS4) are different from the imaging parameters used for the excitation of the plurality of slices (block VS1). The method 300 may also include acquiring (block VS5) the MR data in the slices for the fingerprinting, which follows the simultaneous excitation of a plurality of slices (block VS4).

In an embodiment, the excitation of a plurality of slices (block VS4) and the acquisition of (block VS5) the MR data in the slices for the fingerprinting may be performed (i.e. repeated) multiple times. In doing so, a plurality of MR images are reconstructed for each slice, with the result being that an MR signal evolution (fingerprint) can be generated for each voxel within the slices, as is shown in FIG. 2. Then, the physical properties of the voxel concerned are determined from this MR signal evolution.

Although the embodiments of the present disclosure have been illustrated and described in detail using the preferred exemplary embodiment, the disclosure is not limited by the disclosed examples, and a person skilled in the art can derive other variations therefrom without departing from the scope of protection of the disclosure.

What is claimed is:

1. A computer-implemented method for acquiring at least one quantitative physiological parameter using a magnetic resonance system by means of magnetic resonance (MR) fingerprinting, the method comprising:
   in a first stage:
      simultaneously exciting, via one or more processors, a plurality of slices using at least one imaging parameter to produce first MR signal evolutions in each of the plurality of slices,
      determining, via one or more processors, a substance associated with at least one slice from among the plurality of slices using results of a first MR fingerprinting measurement associated with the first MR signal evolutions in each respective one of the plurality of slices;
      setting, via one or more processors, a flip-angle characteristic for the at least one slice from among the plurality of slices according to the determined substance; and
   in a second stage that is subsequent to the first stage:
      simultaneously exciting, via one or more processors, the plurality of slices using at least one respective different imaging parameter that is determined based upon the determined substance to produce second MR signal evolutions in each of the plurality of slices, the at least one different imaging parameter including a flip angle such that a flip angle that is used to excite one of the plurality of slices is different than a flip angle that is used to excite another one of the plurality of slices;
      simultaneously acquiring, via the one or more processors, MR data based on the simultaneously excited plurality of slices to provide second MR fingerprinting measurements associated with the second MR signal evolutions in each respective one of the plurality of slices; and
      using the second MR fingerprinting measurements to acquire the at least one quantitative physiological parameter.

2. A controller of a magnetic resonance (MR) system for acquiring at least one quantitative physiological parameter by means of MR fingerprinting, comprising:
   a radio frequency (RF) control unit;
   an RF power amplifier;
   a gradient control unit;
   an image sequence controller; and
   wherein the RF control unit and the RF power amplifier are configured to:
      in a first stage:

simultaneously excite a plurality of slices using at least one imaging parameter to produce first MR signal evolutions in each of the plurality of slices; and in a second stage that is subsequent to the first stage:
simultaneously excite a plurality of slices using at least one respective different imaging parameter to produce MR signal evolutions in each of the plurality of slices, the at least one different imaging parameter that is determined based upon the determined substance to produce second MR signal evolutions in each of the plurality of slices, the at least one different imaging parameter including a flip angle such that a flip angle that is used to excite one of the plurality of slices is different than a flip angle that is used to excite another one of the plurality of slices, wherein the gradient control unit and the image sequence controller are configured to, in the second stage, simultaneously acquire MR data based on the simultaneously excited plurality of slices, and processing circuitry configured to, in the first stage, (i) determine a substance associated with at least one slice from among the plurality of slices using results of a first MR fingerprinting measurement associated with the first MR signal evolutions in each respective one of the plurality of slices, (ii) set a flip-angle characteristic for the at least one slice according to the determined substance, and, in the second stage, (i) perform second MR fingerprinting measurements associated with the second MR signal evolutions in each respective one of the plurality of slices, and (ii) use the second MR fingerprinting measurements to acquire the at least one quantitative physiological parameter.

3. A non-transitory computer readable media of a controller of a magnetic resonance (MR) system, the non-transitory computer readable media having instructions stored thereon that, when executed by one or more processors of the controller, cause the controller to acquire at least one quantitative physiological parameter by means of MR fingerprinting by:

in a first stage:
simultaneously excite a plurality of slices using at least one imaging parameter to produce first MR signal evolutions in each of the plurality of slices;
determine a substance associated with at least one slice from among a plurality of slices using results of a first MR fingerprinting measurement associated with the first MR signal evolutions in each respective one of the plurality of slices;
set a flip-angle characteristic for the at least one slice from among the plurality of slices according to the determined substance;

in a second stage that is subsequent to the first stage:
simultaneously excite a plurality of slices using at least one respective different imaging parameter that is determined based upon the determined substance to produce MR signal evolutions in each of the plurality of slices, the at least one different imaging parameter including a flip angle such that a flip angle that is used to excite one of the plurality of slices is different than a flip angle that is used to excite another one of the plurality of slices;
simultaneously acquire MR data based on the simultaneously excited plurality of slices to provide second MR fingerprinting measurements associated with the second MR signal evolutions in each respective one of the plurality of slices; and use the second MR fingerprinting measurements to acquire the at least one quantitative physiological parameter.

4. The method as claimed in claim 1, further comprising:
setting, in the second stage via the one or more processors, a flip-angle characteristic for each respective one of the plurality of slices to adjust power needed to meet power limits of an RF power amplifier associated with the magnetic resonance system.

5. The method as claimed in claim 4, wherein a sum of the flip angles that are used to simultaneously excite the plurality of slices is smaller than a predetermined threshold value that is defined based upon the power limits of the RF power amplifier.

6. The method as claimed in claim 4, wherein, during the simultaneously excitation of the plurality of slices, a sum of the flip angles that are used to simultaneously excite the plurality of slices is constant.

7. The method as claimed in claim 1, further comprising:
setting, in the second stage via the one or more processors, a flip-angle characteristic of each respective one of the plurality of slices based upon a determined substance for each respective one of the plurality of slices, and
wherein physical properties of the substance for each respective one of the plurality of slices are determined based upon the MR data that is to be acquired for each respective slice from among the plurality of slices.

8. The controller as claimed in claim 2, further comprising:
setting, in the second stage via the processing circuitry, a flip-angle characteristic for each respective one of the plurality of slices to adjust power needed to meet power limits of the RF power amplifier.

9. The controller as claimed in claim 8, wherein a sum of the flip angles that are used to simultaneously excite the plurality of slices is smaller than a predetermined threshold value that is defined based upon the power limits of the RF power amplifier.

10. The controller as claimed in claim 8, wherein, during the simultaneous excitation of the plurality of slices, a sum of the flip angles that are used to simultaneously excite the plurality of slices is constant.

11. The controller as claimed in claim 2, wherein the processing circuitry is further configured to set, in the second stage, a flip-angle characteristic of each respective one of the plurality of slices based upon a determined substance for each respective one of the plurality of slices, and
wherein physical properties of the substance for each respective one of the plurality of slices are determined based upon the MR data that is to be acquired for each respective slice from among the plurality of slices.

12. The non-transitory computer readable media as claimed in claim 3, further including instructions that, when executed by one or more processors of the controller, cause the controller to:
set, in the second stage, a flip-angle characteristic for each respective one of the plurality of slices to adjust power needed to meet power limits of an RF power amplifier associated with the magnetic resonance system.

13. The non-transitory computer readable media as claimed in claim 12, wherein a sum of the flip angles that are used to simultaneously excite the plurality of slices is smaller than a predetermined threshold value that is defined based upon the power limits of the RF power amplifier.

14. The non-transitory computer readable media as claimed in claim 12, wherein, during the simultaneous excitation of the plurality of slices, a sum of the flip angles that are used to simultaneously excite the plurality of slices is constant.

15. The non-transitory computer readable media as claimed in claim 3, further including instructions that, when executed by one or more processors of the controller, cause the controller to:
   set, in the second stage, a flip-angle characteristic of each respective one of the plurality of slices based upon a determined substance for each respective one of the plurality of slices, and
   wherein physical properties of the substance for each respective one of the plurality of slices are determined based upon the MR data that is to be acquired for each respective slice from among the plurality of slices.

16. The method of claim 7, wherein at least two of the plurality of slices in the first and the second stage are associated with different respective substances.

17. The method of claim 16, wherein the at least two of the plurality of slices associated with different respective substances are identified with different regions of a head of a subject under examination for which the MR data is acquired.

* * * * *